United States Patent [19]

Laviron

[11] Patent Number: 4,669,083
[45] Date of Patent: May 26, 1987

[54] APPARATUS FOR THE SIMULATION OF THE FAILURE OR SATISFACTORY OPERATION OF A LOGIC SYSTEM

[75] Inventor: André Laviron, Fontaine les Dijon, France

[73] Assignee: Commissariat a l'Energie Atomique, Paris, France

[21] Appl. No.: 746,659

[22] Filed: Jun. 20, 1985

[30] Foreign Application Priority Data

Jul. 3, 1984 [FR] France .................................. 84 10516

[51] Int. Cl.⁴ .............................................. G06F 11/00
[52] U.S. Cl. ...................................... 371/23; 364/578
[58] Field of Search ................. 371/23; 364/578, 200, 364/900; 324/73 R, 73 AT, 73 PC

[56] References Cited

U.S. PATENT DOCUMENTS

| | | | |
|---|---|---|---|
| 3,649,910 | 3/1972 | Visani | 324/73 R |
| 3,702,011 | 10/1972 | Armstrong | 371/23 |
| 3,775,598 | 11/1973 | Chao et al. | 371/23 |
| 4,342,093 | 7/1982 | Miyoshi | 364/578 |
| 4,472,804 | 9/1984 | Fullwood et al. | 371/23 |
| 4,527,249 | 7/1985 | Van Brunt | 364/578 |
| 4,590,581 | 5/1986 | Widdoes, Jr. | 364/578 |

OTHER PUBLICATIONS

Andov, Difficulties in Fault-Tree Synthesis for Process Plant, IEEE Trans. on Reliability, vol. R-29, No. 1, Apr. 1980, pp. 2-9.

Primary Examiner—Charles E. Atkinson
Attorney, Agent, or Firm—Oblon, Fisher, Spivak, McClelland & Maier

[57] ABSTRACT

An apparatus for simulating the failure or satisfactory operation of a system having a plurality of interconnected components. These components are subject to events, such as failures or repairs appearing in a sequentially combined manner. The apparatus comprises a group of simulation means representing the component to be simulated and each having at least one simulation input. The repair or failure state of the component is represented by a signal supplied on at least one output of the simulation means. This signal has a first or a second logic state respectively corresponding to the repair or failure of the component. The apparatus also comprises means for interconnecting the simulation means in accordance with a logic representing the interconnection of the components in the simulated logic system. These interconnection means have an output supplying signals, whose logic state represents the repair or failure of the simulated system.

6 Claims, 3 Drawing Figures

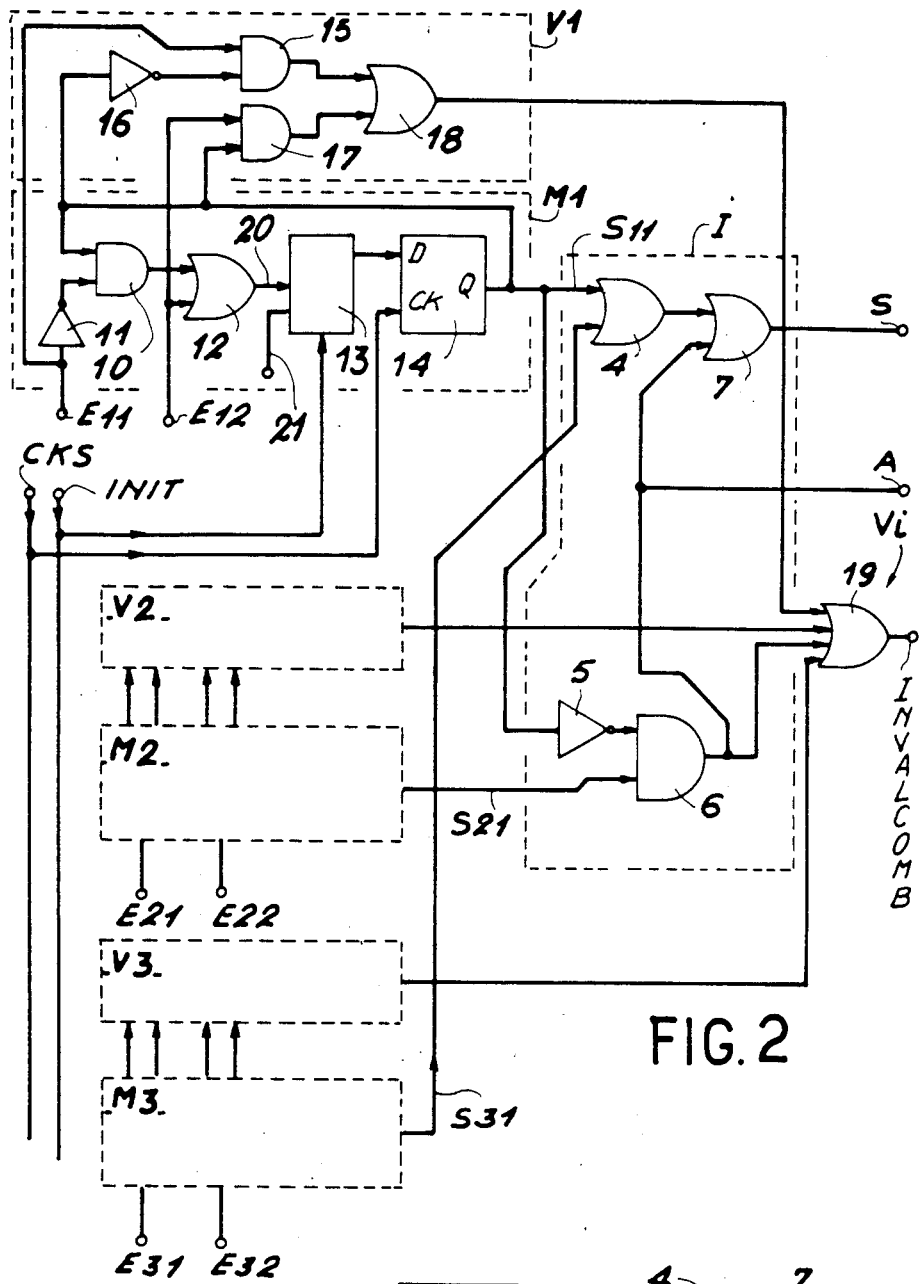
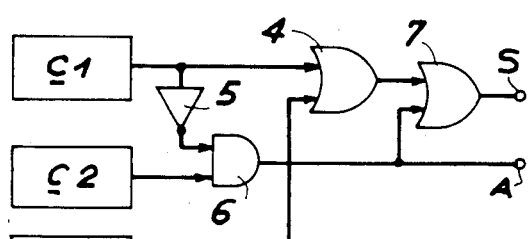
FIG. 1
FIG. 2

APPARATUS FOR THE SIMULATION OF THE FAILURE OR SATISFACTORY OPERATION OF A LOGIC SYSTEM

BACKGROUND OF THE INVENTION

The present invention relates to an apparatus for simulating the failure or satisfactory operation of a logic system. This apparatus makes it possible to simulate a system incorporating a plurality of interconnected logic components, by subjecting the latter to events, such as failures or repairs. These events are simulated by combined level 0 and level 1 logic signals in sequences. These simulation signals make it possible to determine the sequences for which the bringing into a failure or satisfactory repair operation state of one or more components of the system leads to the failure or satisfactory repair operation of the system or vice versa.

It is known that for simulating the failure or satisfactory operation of a mechanical, hydraulic or similar system, it is often necessary to replace this system by a simulation apparatus incorporating a group of logic means equivalent to the components of the system. Each of these means comprises simulation inputs to which are applied simulation signals, whose logic states respectively represent either the failure, or the satisfactory repair operation of the components which is wished to simulate. These logic means are interconnected in such a way that on one common output, signals resulting from the simulation of the failures or satisfactory repair operations of the different components have a logic state corresponding either to the failure state, or to the satisfactory operation state of the simulated system.

Thus, the apparatus according to the invention makes it possible to simulate all the systems able to operate on the basis of the reception in sequence of combined level 0 or 1 logic signals.

It is known that the failure or satisfactory operation of the components of a system can be simulated by signals occurring either simultaneously, or separately. The failure of a system is studied by applying level 0 or 1 signals to the inputs of a simulation apparatus in order to simulate the failure (breakdown) or satisfactory operation (repair) of the corresponding components of the system. For each of the combinations of logic simulation signals applied to the inputs of the simulation apparatus, the response of the apparatus (logic level 0 or 1) of the output signal thereof) is analysed, to establish whether it is a question of a combination of logic signals which may or may not lead to the failure of the system. The list of combinations of level 0 or 1 logic signals associated with the responses of the apparatus makes it possible to analyze the simulated system for reliability studies.

These simulation apparatuses are particularly useful in nuclear power stations, aircraft, oil field investigation systems, etc, in which it is necessary to use security or control systems having a high degree of reliability and consequently, for this reason, redundant channels. The latter make it possible to ensure that a failure of one of the components of one of the channels does not prevent the system from triggering the desired security or control action. These redundant channels also make it possible to repair or check one or more channels, without preventing the desired security or control action during said check or repair.

Different methods have been used for analyzing the reliability of control or security systems. Unfortunately, these methods generally use the so-called failure tree principle, which requires the use of a power computer, when the system to be checked is complex. These difficulties are described in the article by P.K. ANDOW entitled "Difficulties in fault tree synthesis for process plant", published in the Journal IEEE Transactions on Reliability, Vol. R29, April 1980, pp. 2 to 9.

The difficulties appearing in the reliability analysis of a system on the basis of the failure tree of this system can be surmounted as a result of the use of wired simulation apparatuses or circuits equivalent to the system to be analyzed. These circuits are described e.g. in the article entitled "Verification of fault tree analysis", published in the Journal EPRI-NP-1570, Vols 1 and 2, May 1981 by the Electric Power Research Institute. These simulation apparatuses or devices make it possible to obviate the design of a failure tree of a system. However, they have very limited performance characteristics, because they only permit a reliability study of systems having at the most 20 components.

More recently, a combined logic signal generator has been developed, which makes it possible to investigate the reliability of systems on the basis of simulation circuits or apparatuses. This generator is described in the article by A. LAVIRON, entitled "ESCAF-Failure simulation and reliability calculation device" 2nd National Reliability Conference, Birmingham, England, Vol. 2 March 1979, pp. 6C/4/1 - 6C/4/10. This combined logic signal generator makes it possible to study the reliability of complex systems via logic simulation circuits or apparatuses. On N of its outputs, it supplies all the possible combinations of P logic signals of level 1 and N-p logic signals of level 0. As a function of sought reliability tests, these logic signals are applied to the inputs of components of the simulation apparatus, so as to simulate either the satisfactory operation of each component for example (logic level 0 of the signal applied to one input of the component), or the failure of each component (logic level 1 applied to the input of said component). These logic signals simulating the failure or satisfactory operation of one or more components of the simulated systems make it possible to observe on the output of the simulation apparatus whether the failure or satisfactory operation of one or more components of the system leads to the failure (breakdown) or satisfactory operation (repair) of said system. The aforementioned generator only permits the simulation of events (failure or satisfactory operation of components of a system) which occur simultaneously for investigations in which the arrival order of the events is not significant. This generator, which constitutes an obvious advance compared with simulation systems using power computers (e.g. of the CRAY I type) still does not make it possible to simulate events (failure or satisfactory operation of components of a system), which occur successively or sequentially. However, it is often necessary in a reliability study of the system to involve failure or satisfactory operation sequences in which the order of arrival of the events is of great importance for the reliability study. The simulation technique (failure tree) used with the aforementioned generator cannot then be used. These known techniques require the drawing up of a MARKOV diagram, which is generally very complex and which cannot be prepared for a system which has numerous components.

More recently, a combined logic signal sequential generator has been developed and is described in U.S. patent application Ser. No. 746,307 filed on June 19, 1985 in the name of the same Applicant. It makes it possible to supply combined simulation signals in sequence.

SUMMARY OF THE INVENTION

In conjunction with a sequential generator of this type, the simulation apparatus according to the invention makes it possible to simulate the failure or satisfactory operation of a system, in which the failures or satisfactory operations of the components occur sequentially. This apparatus does not suffer from the limitations of known simulation apparatuses (which only permit the simulation of systems having a maximum of 20 components), because it makes it possible to simulate systems having up to 80 components. Under certain conditions which will be defined hereinafter, it also makes it possible to trigger off an alarm, or indicate that a sequence of simulation signals applied to the inputs of the apparatus must be invalidated, when said sequence does not correspond to the desired sequence.

The present invention therefore relates to an apparatus for simulating the failure or satisfactory operation of a system having a plurality of interconnected components $C_i$, which are subjected to events such as failures or repairs appearing in a combined manner in sequence, wherein it comprises a group of simulation means $M_i$, each having at least one simulation output $S_{ij}$ and at least one simulation input $E_{ik}$, each means $M_i$ being a logic assembly having the components $C_i$ to be simulated, the satisfactory operation or failure state of component $C_i$ being represented by a signal supplied on at least one output $S_{ij}$ of means $M_i$, said signal having a first or second logic state respectively corresponding to the satisfactory operation or failure of the corresponding component $C_i$, each simulation input $E_{ik}$ receiving a logic simulation signal having a state corresponding to the simulated event and which may or may not bring about the change of state of the signal on the corresponding output $S_{ij}$ of circuit $M_i$, together with means I for interconnecting the simulation means $M_i$ in accordance with a logic representing the interconnection of the components $C_i$ in the simulated logic system, these interconnection means I having an output S supplying a signal, whose logic state represents the satisfactory operation or failure of the simulated system.

According to another feature, the apparatus comprises invalidation means V connected to the group of simulation means $M_i$, said invalidation means supplying an INVALCOMB signal for invalidating any sequence of signals applied to the inputs $E_{ik}$, when the configuration of the sequence of logic signals applied to these inputs does not correspond to the desired configuration.

According to another feature, the invalidation means V are also connected to the interconnection means I.

According to another feature, the simulation means $M_i$ in each case comprise a simulation AND gate with two inputs, one of the inputs of said AND gate being connected to the output of a simulation inverter, whereof an input can receive the simulation signal whose logic state corresponds to the failure of the corresponding components $C_i$, a simulation OR gate with two inputs, one of the inputs of said OR gates being able to receive a simulation signal whose logic state corresponds to the satisfactory operation of the corresponding component $C_i$, the other input of said OR gate being connected to an output of the simulation AND gate, a multiplexer, whereof an input is connected to an output of said simulation OR gate and whereof another input receives an initialization signal, a D flip-flop, whose input D is connected to an output of the multiplexer and whose clock inputs CK receives clock pulses, the output Q of said flip-flop being connected to the other input of the simulation AND gate, said output constituting the output $S_{ij}$ of the simulation means $M_i$ in question.

According to another feature, the invalidation means V comprise for each simulation means $M_i$ an invalidation circuit having a first AND gate with two inputs, whereof one input $E_{iK}$ can receive the simulation signal whose state corresponds to the failure of the corresponding component $C_i$, an inverter, whereof an input is connected to the output Q of the corresponding D flip-flop and whereof the output is connected to the other input of the first AND gate, a second AND gate whereof one input can receive the simulation signal whose state corresponds to the satisfactory operation of the corresponding component $C_i$, the other input of said second AND gate being connected to the output Q of the corresponding D flip-flop, an output OR gate with two inputs respectively connected to the outputs of the first and second AND gates, the invalidation means also having an invalidation OR gate with inputs respectively connected to the outputs of the output OR gates of the invalidation circuit, one output of the invalidation OR gates optionally supplying said invalidation signal INVALCOMB.

BRIEF DESCRIPTION OF THE DRAWINGS

The invention relates in greater detail hereinafter relative to non-limitative embodiments and the attached drawings, wherein show:

FIG. 1 diagrammatically, an example of a system with three components, which can be simulated by means of the apparatus according to the invention.

FIG. 2 diagrammatically and in greater detail, the apparatus according to the invention applied to the simulation of the system of FIG. 1.

DETAILED DESCRIPTION OF THE PREFERRED EMBODIMENTS

Figure 3:
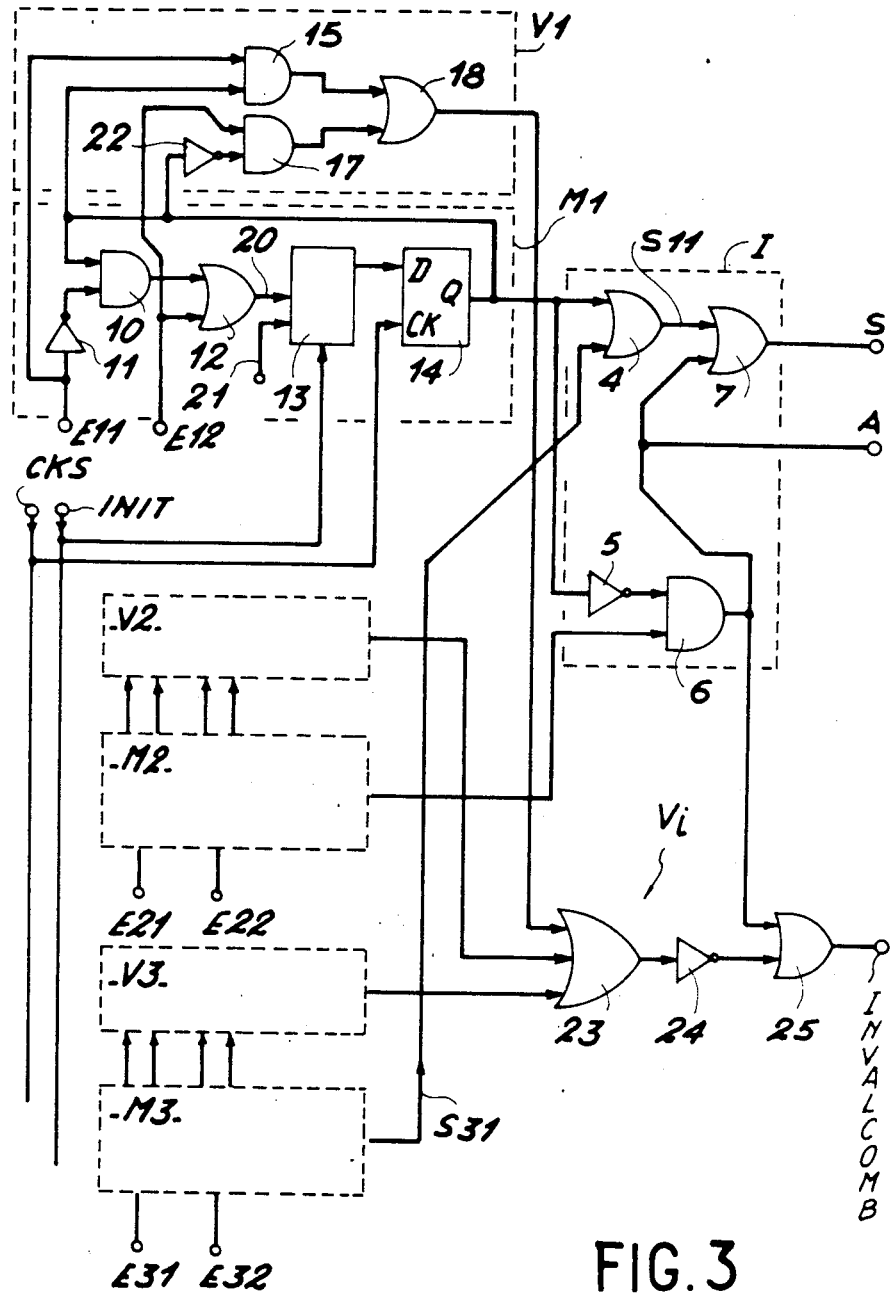
FIG. 3 diagrammatically, another embodiment of the apparatus according to the invention.

FIG. 1 diagrammatically shows a system having three components $C_1$, $C_2$, $C_3$, which can be simulated by means of the apparatus according to the invention. In this system, it is assumed that component $C_2$ is solely constituted by an assembly supervising the operation of component $C_1$. This supervisor is able to supply a logic level 1 alarm signal, e.g. to an output A, when component $C_1$ is in a failure state. It is also assumed that components $C_1$ and $C_3$ are interconnected with the aid of an OR gate 4 supplying at its output a logic level 1 signal, when component $C_1$ or component $C_3$ are in a satisfactory operating state.

In this example, an alarm signal is supplied to the output A of supervisor $C_2$, if component $C_1$ is brought into a failure state (output signal with logic state 0) and the supervisor is not in a failure state. However, if component $C_2$ supervising the operation of component $C_1$ is brought into a failure state before component $C_1$, without component $C_3$ being defective, no alarm is generated, whereas component $C_1$ can be defective and this is not noted because the actual supervisor $C_2$ is defective. In order to represent this operation, it is merely necessary to use interconnection means of components $C_1$, $C_2$, $C_3$, which comprise an inverter 5, an AND gate 6 and an OR gate 7. The input of inverter 5 is connected to the output of component $C_1$. The output of this inverter is connected to one of the inputs of AND gate 6. The other input of gate 6 is connected to the output of supervisor $C_2$. The output of AND gate 6 supplies an alarm signal in the case of a failure of component $C_1$ and it is connected to an input of OR gate 7. Another input of gate 7 is connected to an output of OR gate 4. Output S of OR gate 7 constitutes the aforementioned output S. This output supplies a logic level 0 signal when components $C_1$ and $C_3$ are simultaneously in a failure state and there is no simulated alarm at the output of AND gate 6. Output S supplies a logic level 1 signal when components $C_1$ or $C_3$ are operating satisfactorily. As a result of inverter 5 and AND gate 6, a logic level 1 alarm signal is supplied to output A, when component $C_1$ is brought into a failure state before supervisor component $C_2$, which is responsible for monitoring $C_1$, which is itself in a defective state.

FIG. 2 diagrammatically shows the simulation apparatus according to the invention making it possible to simulate components $C_1$, $C_2$, $C_3$ of the system shown e.g. in FIG. 1. As will be shown in greater detail hereinafter, this apparatus includes OR gate 7, whereof output S supplies a signal whose logic state represents a satisfactory operation or failure state of the simulated system, a circuit making it possible to interconnect the components of the system, as well as means, to be described in greater detail hereinafter, and which make it possible to invalidate certain sequences of combined logic signals, applied to the inputs of the apparatus.

The simulation apparatus shown makes it possible to simulate the failure or satisfactory operation of a system having a plurality of interconnected components $C_i$, which are subject to events such as failures or repairs (or satisfactory operations), appearing in a combined manner and in sequence. The apparatus according to the invention comprises a group of simulation means $M_i$, each having at least one simulation output $S_{ij}$ and at least one simulation input $E_{ik}$. Each means $M_i$ is a logic assembly representing a component $C_i$ of the system to be simulated. In its application to the system of FIG. 1, the apparatus according to the invention comprises simulation means $M_1$, $M_2$, $M_3$. The outputs $S_{ij}$ of these means are respectively designated $S_{11}$, $S_{21}$ $S_{31}$. The simulation inputs $E_{ik}$ of each component are respectively represented for simulation means $M_1$, $M_2$, $M_3$ at $E_{11}$ and $E_{12}$, $E_{21}$ and $E_{22}$, as well as $E_{31}$ and $E_{32}$. The failure or satisfactory operation state of each component $C_i$ is represented by a signal supplied on the output $S_{ij}$ of the corresponding means $M_i$. This signal has a first logic state or a second logic state respectively corresponding to the satisfactory operation (repair) or failure (breakdown) of the component $C_i$ in question. Thus, for example, the failure of component $C_i$ is represented on output $S_{11}$, by a signal having a second logic state (e.g. logic state 0). The satisfactory operation or repair of this component is represented on output $S_{11}$ by a signal having a first logic state (.e.g. logic state 1). The simulation input $E_{ik}$ of each means $M_i$ receiving a logic simulation signal having a logic state corresponding to the simulated event, and which does or does not change the state of the signal on the corresponding output $S_{ij}$ of circuit $M_i$. Thus, for example, the simulation of the satisfactory operation of component $C_i$ is obtained by applying a logic level 1 simulation signal to input $E_{12}$ of simulation means $M_1$ (input $E_{11}$ being at logic level 0). In the same way, the failure of component $C_1$ is obtained by applying a logic level 1 signal to input $E_{11}$ of simulation means $M_1$ (input $E_{12}$ being at logic level 0). The same applies for simulation signals applied to inputs $E_{22}$ and $E_{21}$ of simulation means $M_2$ corresponding to component $C_2$ and for signals applied to the input $E_{32}$ and $E_{31}$ of the simulation means $M_3$ corresponding to component $C_3$.

The simulation signals applied to the inputs $E_{ik}$ are e.g. supplied by a sequential generator, as described in U.S. Pat. No. 4,547,861 by same Applicant.

The apparatus also comprises means I making it possible to interconnect the simulation means $M_i$ ($M_1$, $M_2$, $M_3$), in accordance with a logic representing the interconnection of the component $C_i$ of the simulated logic system. Thus, in the example shown in the drawings, corresponding to the simulation of the system according to FIG. 1, the interconnection means I comprise two OR gates 4, 7, an AND gate 6 and an inverter 5, said gates corresponding to those of FIG. 1. The inputs of the OR gate 4 are respectively connected to the output $S_{11}$ of the simulation means $M_1$ of component $C_1$ and to the output $C_{31}$ of simulation means $M_3$ of component $C_3$. The output of OR gate 4 is connected to an input of the OR gate 7. Another input of OR gate 7 is connected to the output of AND gate 6. An input of AND gate 6 is connected to the output $S_{21}$ of the simulation means $M_2$ of component $C_2$. Another input of this gate is connected to the output of the inverter 5. The input of this inverter is connected to the output $S_{11}$ of the simulation means $M_1$ of component $C_1$. Output S of interconnection means I supplies, as will be shown in greater detail hereinafter, a signal whose logic state represents the satisfactory operation or failure of the system simulated by means $M_1$, $M_2$, $M_3$.

The simulation apparatus also comprises invalidation means $V_i$ connected to the group of simulation means $M_i$. These means optionally supply on an INVAL-COMB output, a logic level 1 signal making it possible to invalidate any sequence of signals applied to inputs $E_{ik}$, when the configuration of this sequence of logic signals does not correspond to a desired configuration and as will be shown in greater detail hereinafter.

Simulation means $M_1$, $M_2$, $M_3$ are identical, only simulation means $M_1$ being shown in detailed manner in the drawing. Each of these simulation means $M_i$ has a simulation AND gate 10 with two inputs. One of the inputs of this gate is connected to the input of a simulation inverter 11. The input of this inverter constitutes the input $E_{11}$ of simulation means $M_1$ and can receive the simulation signal, whose logic state (1 in the considered example) corresponds to the failure of component $C_1$. Simulation means $M_1$ also comprises a simulation OR gate 12 with two inputs. One of the inputs of this OR gate corresponds to simulation input $E_{12}$ of means $M_1$. This input can receive a simulation signal, whose logic state (1 in the considered example) corresponds to the satisfactory operation of component $C_i$. The other input of OR gate 12 is connected to the output of the simulation AND gate 10. Means $M_1$ also comprises a multiplexer 13, whereof one input is connected to the output of simulation OR gate 12 and whereof another input receives, on initialization, a logic level 1 INIT signal, as will be shown hereinafter. Finally, simulation means $M_1$ comprises a D flip-flop 14, whose input D is connected to an output of the multiplexer 13 and whereof the clock input $C_k$ receives clock pulses CKS.

Output Q of flip-flop 14 is connected to the other input of the simulation AND gate 10. Output Q of flip-flop 14 constitutes the output $S_{11}$ of the simulation means $M_1$ in question. The other simulation means $M_2$, $M_3$ are not described in detail because they are constructed in the same way as simulation means $M_1$.

For each simulation means $M_i$, the invalidation means comprise an invalidation circuit $V_i$. Thus, in the considered application example, the invalidation means comprise invalidation circuits $C_1$, $V_2$, $V_3$ respectively connected to the simulation means $M_1$, $M_2$, $M_3$. Invalidation circuits $V_1$, $V_2$, $V_3$ are identical and only circuit $V_1$ will be described in detail. This circuit comprises a first AND gate 15 with two inputs, whereof one input can receive the simulation signal applied to input $E_{11}$ of means $M_1$, the logic state 1 of said signal corresponding to the simulation of the failure of component $C_1$. Invalidation circuit $V_1$ also comprises an inverter 16 having an input connected to the output Q of the corresponding D flip-flop 14. The output of this inverter is connected to the other input of the first AND gate 15. Circuit $V_1$ also comprises a second AND gate 17, whereof one input is connected to the input $E_{12}$ of simulation means $M_1$ for receiving the simulation signal, whose logic state 1 corresponds to the repair of component $C_1$. The other input of the second AND gate 17 is connected to the output Q of flip-flop D 14. Thus, invalidation circuit $V_1$ comprises an output OR gate 18. The latter has two inputs respectively connected to the outputs of the first and second AND gates 15, 17. The invalidation means also have an invalidation OR gate 19, whose inputs are respectively connected to the outputs of the OR gates 18 of invalidation circuits $V_1$, $V_2$, $V_3$. An output of the invalidation OR gates 19 supplies, under certain conditions to be described hereinafter, a logic level 1 INVALCOMB signal making it possible to invalidate a sequence of simulation signals applied to the inputs of simulation means $M_1$, $M_2$, $M_3$. An input of the OR gate 19 is also connected to the output of the AND gate 6 of the interconnection means I.

Simulation means $M_1$, $M_2$, $M_3$ operate in a similar manner. The same applies with regards to the operation of simulation circuits $V_1$, $V_2V_3$. Only the operations of the simulation means $M_1$ and the invalidation circuit $V_1$ will now be described in detail.

At the start of a sequence of combined logic signals (logic level 1 and 0 as a function of the simulation to be performed) applied to inputs $E_{11}$, $E_{12}$ ... $E_{32}$ of simulation means $M_1$, $M_2$, $M_3$ of the simulation apparatus of the system of FIG. 1, a logic level 1 initialization signal INIT is e.g. applied by the aforementioned sequential generator to the corresponding input of the apparatus according to the invention. This signal is supplied to the multiplexers (such as multiplexer 13) of simulation means $M_1$, $M_2$, $M_3$. This logic level 1 signal appears on the corresponding outputs of the multiplexers and is applied to the D inputs of the flip-flops (such as flip-flop 14) of means $M_1$, $M_2$, $M_3$. All the D flip-flops then store the logic level 1 at the first dock pulse CKS supplied at the same time as the INIT signal to the inputs CK of the flip-flops. The outputs Q of flip-flops 14 of simulation means $M_1$, $M_2$, $M_3$ then respectively logic level 1 signals. A logic level 1 signal is then supplied on initialization to output S of interconnection means I by means of OR gates 4, 7. Thus, each of the multiplexers 13 comprises two inputs, an input 20 connected to the output of OR gate 12 and an input 21 receiving a signal, whereof the logic level corresponds to the initialization logic level of the component, which is generally logic level 1. The INIT signal from OR gate 12 on initializing the component is used for selecting the logic level of the signal present at input 21. The logic level on input 21 can be zero if, on initialization, it is decided that the component corresponding to the multiplexer in question is defective. When initialization of the simulation apparatus has taken place, there will then be an application to the simulation inputs of means $M_1$, $M_2$, $M_3$ of combined logic signal sequences of levels 1 and 0 dependent on the simulation performed (failure of certain components and satisfactory operation of others.). If at time $t_i$, a logic level 1 simulation signal is e.g. applied to input $E_{11}$ of means $M_1$ for simulating the failure of the corresponding component $C_1$, at the same time as a clock pulse CKS is applied to flip-flop 14, the latter supplies to output $S_{11}$ a logic level 0 signal representing the failure of component $C_1$. It is obviously assumed in this case that the signal applied at this tine to input $E_{12}$ of simulation means $M_1$ is a logic level 0 signal. It can also be assumed that for this sequence at time $t_i$, logic level 0 signals are applied to inputs $E_{22}$ and $E_{32}$ and that the logic level 0 signals are also applied to the inputs $E_{21}$ and $E_{31}$ of simulation means $M_2$, $M_3$ for maintaining the satisfactory operation of the corresponding components $C_2$, $C_3$. Thus, for this sequence at time $t_i$, the output $S_{11}$ of means $M_1$ is at logic level 0, whilst the outputs of means $M_2$, $M_3$ are at logic level 1. Output S of interconnection means I is consequently at logic level 1. This logic level indicates that the system of FIG. 1 is in a satisfactory operation state, when only component $C_1$ is in a failure state.

If at time $t_{i+1}$ for example, the sequence of combined simulation signals applied to the inputs of means $M_1$, $M_2$, $M_3$ is such that the outputs $S_{11}$ and $S_{31}$ are at logic level 0 (indicating the failure of the corresponding components $C_1$ and $C_3$), output S of OR gate 4 of interconnection means I is itself at logic level 0, which indicates the total failure of the simulated system. Component $C_2$ is a supervisor in the considered application example. In this example, as supervisor $C_2$ is not defective, as from instant $t_i$, output S of OR gate 7 is at logic level 1 (because $S_{21}=1$ and $S_{11}=0$) and a logic level 1 alarm signal is supplied to output A.

If output $S_{11}$ is at logic level 0 for indicating a failure of component $C_1$, whereas output $S_{21}$ of component $C_2$ (a supervisor in the considered application example) has a satisfactory operation state (logic level 1 on output $S_{21}$), an alarm is triggered on output A of AND gate 6. The logic level 1 signal, which is then present on the output of AND gate 6 is applied to the input of OR gate 6. Thus, the logic level 1 signal on the output of AND gate 6 inhibits the passage to logic level 0 of the signal on output S of OR gate 7. The output of AND gate 6 is also connected to OR gate 19 and a logic level 1 INVAlCOMB signal appears on the output of said OR gate 19. This signal indicates that the sequence of logic signals present on the simulation inputs of means $M_1$, $M_2$, $M_3$ must be invalidated, because said sequence which should have produced on output S a logic level 0 signal indicating the failure of the system, in fact produces a logic level 1 signal indicating its satisfactory operation.

. The invalidation circuits $V_1V_2$, $V_3$, whose outputs are connected to theinputs of the output OR gate 19 also make it possible to invalidate any sequence by a logic level 1 INVALCOMB signal on the output of OR gate 19 under the following conditions. When a logic level 1 failure signal is applied at a time $t_i$ to a failure input (such as $E_{11}$ for example), whereas the output of the corresponding component is already at logic level 0 at time $t_i$, or when a logic level 1 signal is applied at a time $t_i$ to a repair input (e.g. $E_{12}$), whereas the corresponding output is already at logic level 1 at time $t_i$. In these two cases, the INVALCOMB signal on the output of OR gate 19 passes to logic level 1 to indicate that the corresponding sequence must not be taken into consideration, because the simulated event has no action on the component.

FIG. 3 diagrammatically shows another embodiment of the apparatus according to the invention. The same elements carry the same references in FIG. 3 as in FIG. 2. The differences between the embodiment of FIG. 3 and the embodiment of FIG. 2 essentially relate to the invalidation means $V_1$ respectively connected to the simulation means M, as well as then to the output circuit of said invalidation means supplying, on an INVALCOMB output, a logic level 1 invalidation signal under conditions to be described in greater detail hereinafter.

In the embodiment of FIG. 3, the invalidation means $V_i$, such as means $V_1$, no longer have an inverter on one of the inputs of the AND gate 15, but incorporate an inverter 22 connecting one of the inputs of AND gate 17 to the output of flip-flop 14. The other connecting elements of said invalidation means $V_1$ are unchanged.

In this embodiment, the output circuit of the invalidation means able to supply an invalidation signal under certain conditions to an INVALCOMB output, is no longer constituted by a single OR gate, as in the preceding embodiment, but by an OR gate 23, an inverter 22 and an OR gate 25. The inputs of OR gate 23 are respectively connected to the outputs of invalidation means $V_1$, $V_2$, $V_3$. The output of OR gate 23 is connected to the input of inverter 24. The two inputs of OR gate 25 are respectively connected to the output of inverter 24 and to the output of AND gate 6 of interconnection means I.

In this other embodiment, the sequential generator applies signals representative of a breakdown or repair to inputs $E_{ik}$, one by one and at different times. If at a given time, e.g. a logic level 1 signal representing a failure or breakdown (which is therefore alone at this time) reaches a simulation of an already defective component, no logic level 1 signal is transmitted to OR gate 23. Thus, the output of said OR gate 23 is at logic level 0 and the output of inverter 24 is at logic level 1. A logic level 1 invalidation signal is then supplied to the INVALCOMB output of OR gate 25.

What is claimed is:

1. An apparatus for the simulation of the failure or satisfactory operation of a system incorporating a plurality of interconnected components, said components being subject to events such as failures or repairs appearing in a sequentially combined manner, wherein said apparatus comprises a group of simulation means, each having at least one simulation output and at least one simulation input, each means being a logic assembly representing the component to be simulated, the repair or failure state of the component being represented by a signal supplied to at least one output of the means, said signal having a first or a second logic state respectively corresponding to the repair or failure of the corresponding component, each simulation input receiving a logic simulation signal having a first or second state corresponding to the simulated event and which may or may not bring about the change of state of the signal on the corresponding output of the circuit, and means for interconnecting the outputs of the simulation means according to a logic representing the interconnection of the components in the simulated logic system, said interconnection means having an output supplying a signal whose logic state represents the repair or failure state of the simulated system.

2. A simulation apparatus according to claim 1, wherein it comprises invalidation means connected to the group of simulation means, said invalidation means supplying a signal for invalidating any sequence of signals applied to the inputs of the simulation means, when the configuration of the sequence of logic signals applied to these inputs does not correspond to a desired configuration.

3. A simulation apparatus according to claim 2 wherein the invalidation means are also connected to said interconnecting means.

4. A simulation apparatus according to claim 3, wherein each of the simulation means has a simulation AND gate with two inputs, one of the inputs of said AND gate being connected to the output of the simulation inverter, whereof one input can receive the simulation signal, whose logic state corresponds to the failure of the corresponding component, a simulation OR gate with two inputs, one of the inputs of said OR gate being able to receive a simulation signal, whose logic state corresponds to the repair of the corresponding component, the other input of said simulation OR gate being connected to an output of the simulation AND gate, a multiplexer whereof one input is connected to an output of the simulation OR gate, two other inputs of the multiplexer respectively receiving an initialization signal, as well as a signal whose logic level corresponds to the failure or repair of the corresponding component on initialization, a D flip-flop, whose input is connected to an output of the multiplexer and whereof a clock input receives clock pulses, the output of said flip-flop being connected to the other input of the simulation AND gate, said output constituting the output of the simulation means in question.

5. An apparatus according to claim 4, wherein the invalidation means comprise for each simulation means, an invalidation circuit having a first AND gate with two inputs, whereof one input can receive the simulation signal, whose logic state corresponds to the failure of the corresponding component, an inverter whereof an input is connected to the output of the corresponding D flip-flop and whose output is connected to the other input of the first AND gate, a second AND gate whereof an input can receive the simulation signal, whose logic state corresponds to the repair of the corresponding component, the other input of said second AND gate being connected to the output of the corresponding D flip-flop, an output OR gate with two inputs respectively connected to the outputs of the first and second AND gates, the invalidation means also having at least one invalidation OR gate, whose inputs are respectively connected to the outputs of the output OR gates of the invalidation circuit and to an output of the invalidation OR gate optionally supplying said invalidation signal.

6. An apparatus according to claim 4, wherein the invalidation means incorporate for each simulation means, an invalidation circuit having a first AND gate with two inputs, whereof one input can receive the simulation signal whose logic state corresponds to the failure of the corresponding component, the other input of said first AND gate being connected to the output of the corresponding D flip-flop, a second AND gate, whereof one input can receive the simulation signal whose logic state corresponds to the repair of the corresponding component, an inverter whereof an input is connected to the output of the corresponding D flip-flop and whereof the output is connected to the other input of the second AND gate, an output OR gate with two inputs respectively connected to the outputs of the first and second AND gates, the invalidation means having at least one other OR gate with inputs respectively connected to the outputs of the output OR gates of the invalidation circuits, an output inverter whereof an input is connected to an output of said other OR gate, and an invalidation OR gate whereof an output is connected to an input of the inverter and whereof another input is connected to an output of the interconnection means, an output of the invalidation OR gate optionally supplying said invalidation signal.

* * * * *